(12) United States Patent
Torii

(10) Patent No.: US 8,384,123 B2
(45) Date of Patent: Feb. 26, 2013

(54) SEMICONDUCTOR DEVICE AND METHOD FOR MANUFACTURING SAME

(75) Inventor: Katsuyuki Torii, Niiza (JP)

(73) Assignee: Sanken Electric Co., Ltd., Saitama (JP)

( * ) Notice: Subject to any disclaimer, the term of this patent is extended or adjusted under 35 U.S.C. 154(b) by 68 days.

(21) Appl. No.: 13/120,899

(22) PCT Filed: Oct. 13, 2009

(86) PCT No.: PCT/JP2009/005316
§ 371 (c)(1),
(2), (4) Date: Mar. 24, 2011

(87) PCT Pub. No.: WO2010/050130
PCT Pub. Date: May 6, 2010

(65) Prior Publication Data
US 2011/0175139 A1 Jul. 21, 2011

(30) Foreign Application Priority Data
Oct. 29, 2008 (JP) .................................. 2008-277839

(51) Int. Cl.
*H01L 29/66* (2006.01)
*H01L 21/331* (2006.01)
(52) U.S. Cl. ................ 257/139; 438/135; 257/E29.197; 257/E21.382
(58) Field of Classification Search ................... 257/139, 257/E29.197, E21.382, 138, 341; 438/135, 438/138
See application file for complete search history.

(56) References Cited

U.S. PATENT DOCUMENTS

| 5,808,352 | A | 9/1998 | Sakamoto |
| 2006/0151829 | A1 | 7/2006 | Sakamoto |
| 2007/0026577 | A1* | 2/2007 | Francis et al. ................ 438/133 |
| 2007/0278472 | A1* | 12/2007 | Mauder et al. ................ 257/11 |
| 2008/0315363 | A1* | 12/2008 | Chiola et al. ................ 257/607 |
| 2009/0032851 | A1* | 2/2009 | Pfirsch et al. ................ 257/288 |
| 2009/0072242 | A1* | 3/2009 | Zhang ........................... 257/77 |
| 2010/0224907 | A1* | 9/2010 | Hara ........................... 257/139 |

FOREIGN PATENT DOCUMENTS

| JP | 3-166766 A | 7/1991 |
| JP | 4-269874 A | 9/1992 |
| JP | 8-167619 A | 6/1996 |
| JP | 8-227895 A | 9/1996 |
| JP | 10-270451 A | 10/1998 |

(Continued)

*Primary Examiner* — William D Coleman
*Assistant Examiner* — Christine Enad
(74) *Attorney, Agent, or Firm* — Birch, Stewart, Kolasch & Birch, LLP

(57) ABSTRACT

An IGBT having a good balance between high switching speed and low on-resistance.
Specifically disclosed is an IGBT 10 in which a defect layer 25 is formed in an n layer 102 in an active region 20 and formed in a p-type substrate 101 in a non-active region 40. In other words, the defect layer 25 in the active region 20 is at a shallower position than the defect layer 25 in the non-active region 40 when viewed from the surface. Due to this configuration, the switching speed is increased by reducing the amount of holes injected in the non-active region 40 in the IGBT 10. Meanwhile, the reduction of hole injection amount in the active region 20 is smaller than that in the non-active region 40, and thus increase in the on-resistance is suppressed at that time.

7 Claims, 3 Drawing Sheets

FOREIGN PATENT DOCUMENTS

| | | |
|---|---|---|
| JP | 2001-77357 A | 3/2001 |
| JP | 2001-102392 A | 4/2001 |
| JP | 2002-93813 A | 3/2002 |
| JP | 2003-264288 A | 9/2003 |
| JP | 2003-282575 A | 10/2003 |
| JP | 2005-197472 A | 7/2005 |
| JP | 2006-303145 A | 11/2006 |
| KR | 10-0394393 | 2/2004 |
| KR | 10-0485680 | 8/2005 |
| WO | WO 2009060852 A1 * | 5/2009 |

* cited by examiner

SEMICONDUCTOR DEVICE AND METHOD FOR MANUFACTURING SAME

TECHNICAL FIELD

The present invention relates to a structure of an insulated gate bipolar transistor capable of operating at high current and a manufacturing method of the insulated gate bipolar transistor.

BACKGROUND ART

In recent years, an Insulated Gate Bipolar Transistor (IGBT) capable of being driven at high current is used as a switching element.

FIG. 4 is an example of a cross-sectional structure of a typical IGBT element. In this IGBT element 100, functions of a bipolar transistor and a MOSFET (Metal Oxide Semiconductor Field Effect Transistor) are combined. In this structure, n layer 102 serving as a base of the bipolar transistor is formed on a p-type substrate 101 serving as a collector of the bipolar transistor, and a p$^+$ layer 103, an n$^+$ layer 104, a gate oxide 105 which is a part of the MOSFET, and a gate 106 are formed on the surface side (upper side in FIG. 4). An emitter electrode 107 is connected to the p$^+$ layer 103 and n$^+$ layer 104, and an insulating layer 108 for preventing short-circuit between the emitter electrode 107 and gate 106 is formed. The IGBT 100 is turned ON when the gate voltage thereof is increased not less than a predetermined threshold voltage. At this time, holes are injected from the p-type substrate 101 to n layer 102 to cause conductivity modulation, allowing high current to flow, that is, reducing on-resistance. Therefore, by increasing the amount of holes to be injected, on-resistance (on-voltage) can be reduced. Actually, in most cases, a plurality of the IGBT elements 100 each having the above configuration are formed on a single substrate and are connected in parallel so as to reduce particularly the on-resistance.

When the IGBT element 100 is turned OFF, the gate voltage thereof is decreased to less than the predetermined threshold voltage. At this time, current continues to flow until the holes existing in the n layer 102 at the ON-time disappear. That is, as the electrons disappear when being recombined with electrons, the IGBT 100 is not completely turned OFF until the holes disappear. Therefore, in order to increase the switching speed of the IGBT, it is necessary to reduce the time (lifetime of holes) taken for the holes to disappear.

Therefore, there is proposed a structure for reducing the lifetime of holes in the n layer 102. For example, Patent Document 1 discloses a technique that forms, in the n layer, a defect layer in which the lifetime of the holes is reduced by ion implantation. Further, Patent Document 2 discloses a technique that forms the defect layer on the p-type substrate side. By using these technique, the switching performance of the IGBT element 100 has been improved.

CITATION LIST

Patent Document

[Patent Document 1] Jpn. Pat. Appln. Publication No. 2001-102392
[Patent Document 2] Jpn. Pat. Appln. Publication No. H04-269874

DISCLOSURE OF THE INVENTION

Problems to be Solved by the Invention

However, holes existing in the n layer 102 serving as a base not only contributes a decrease in the switching speed but also directly contributes to a decrease in the on-resistance of the IGBT element due to the operating principle of the IGBT element. Thus, when the lifetime of the holes existing in the n layer 102 is reduced or the injection amount thereof is limited, the switching speed is increased, while the on-resistance is increased. That is, in the above techniques, the switching speed and on-resistance are trade-off.

Thus, it has been difficult to obtain an IGBT having a good balance between high switching speed and low on-resistance (on-voltage).

The present invention has been made in view of the above problem, and an object thereof is to provide an invention solving the above problem.

Means for Solving the Problems

To attain the above object, a semiconductor device according to the present invention has the following configuration.

A semiconductor device according to the present invention which comprises an insulated gate bipolar transistor element of the configuration where an emitter and a gate are formed on the front side thereof, using a p-type substrate as a collector and an n layer as a base, on a semiconductor substrate composed of the p-type substrate and the n layer formed on the p-type substrate, and in which a defect layer in which many crystal defects are introduced is formed in the semiconductor substrate, is characterized in that, when viewed from the surface, the defect layer in an active region where the insulated gate bipolar transistor element is formed on the semiconductor substrate is formed at a shallower position than the defect layer in a non-active region where the insulated gate bipolar transistor element is not formed on the semiconductor substrate.

In the semiconductor device according to the present invention, the defect layer is formed in the active region and the non-active region such that the hole injection amount in the non-active region is smaller than that in the active region.

In the semiconductor device according to the present invention, an emitter common electrode connected to the emitter of the insulated gate bipolar transistor element formed in the active region is formed of a material having higher ion stopping power than that of the semiconductor substrate.

In the semiconductor device according to the present invention, the emitter common electrode is formed of a material containing nickel or an alloy containing nickel.

A semiconductor device manufacturing method according to the present invention is a method of manufacturing a semiconductor device which comprises an insulated gate bipolar transistor element of the configuration where an emitter and a gate are formed on the front side thereof, using a p-type substrate as a collector and an n layer as a base, on a semiconductor substrate composed of the p-type substrate and the n layer formed on the p-type substrate, and in which a defect layer in which many crystal defects are introduced is formed in the semiconductor substrate. The method is characterized by including: a transistor formation step of forming the insulated gate bipolar transistor element on the semiconductor substrate; an electrode formation step of forming, on the insulated gate bipolar transistor element, an emitter common electrode connected to the emitter of the insulated gate bipolar transistor element; and an ion implantation step of forming the defect layer in the semiconductor substrate by performing ion implantation from the front side.

Advantages of the Invention

According to the thus configured present invention, an IGBT having a good balance between high switching speed and low on-resistance (on-voltage).

BEST MODE FOR CARRYING OUT THE INVENTION

Figure 1:
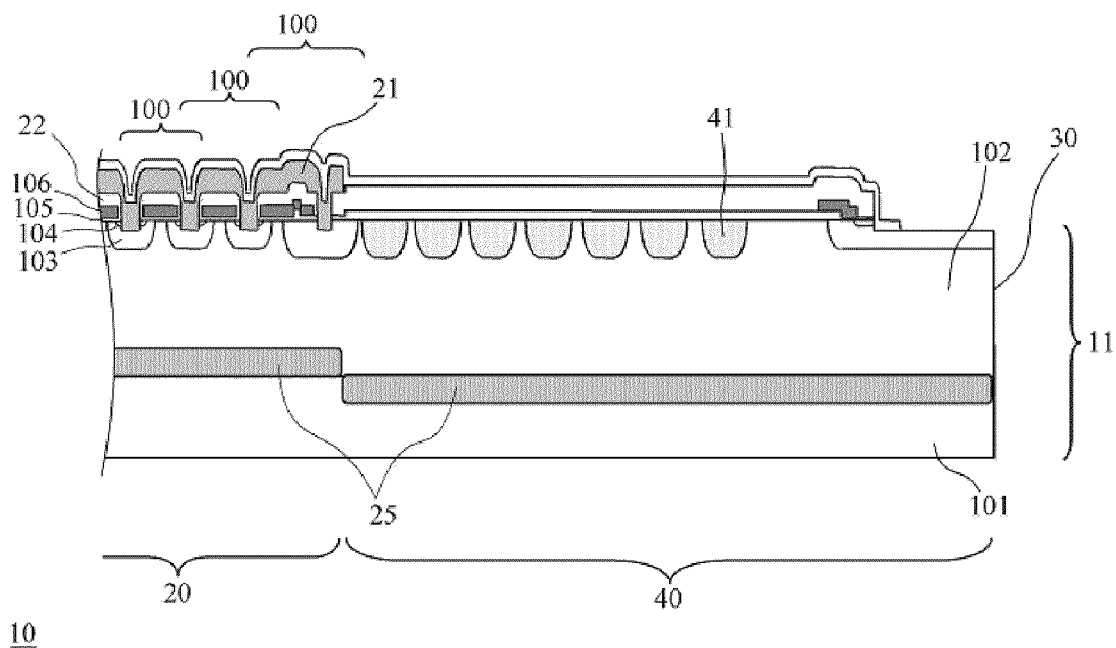
FIG. 1 is a cross-sectional view illustrating a structure of an IGBT according to an embodiment of the present invention.

An IGBT (Insulated Gate Bipolar Transistor) which is a preferred embodiment practicing a semiconductor device according to the present invention will be described. FIG. 1 is a cross-sectional view of a configuration of an IGBT 10.

Figure 4:
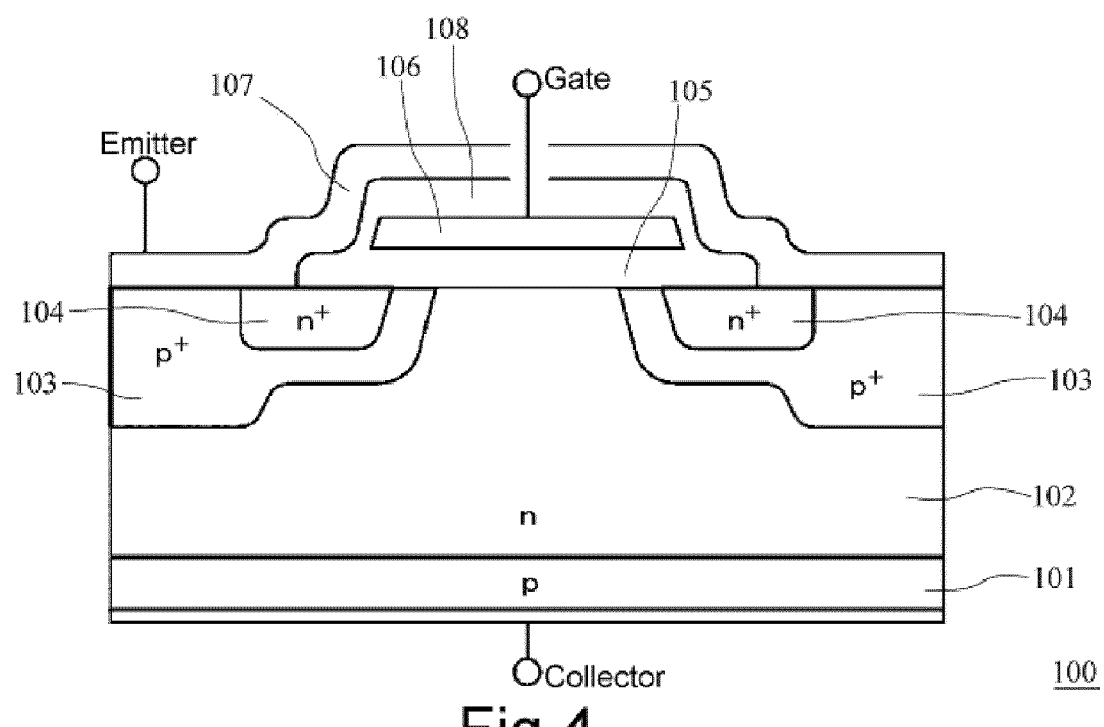
FIG. 4 is a cross-sectional view illustrating a configuration of an IGBT element.

In the IGBT 10, on a semiconductor (silicon) substrate 11, a region (active region 20) in which a plurality of IGBT elements 100 each having the same structure as that of FIG. 4 are arranged and connected in parallel exists at the left side of FIG. 1. In these IGBT elements, one emitter region in FIG. 4 of one IGBT element is shared with the adjacent IGBT element, and a single emitter electrode is shared between all the IGBT elements 100. The right side of FIG. 1 shows a chip peripheral portion (end portion) 30, and no IGBT element is formed between a region (non-active region 40) between the active region 20 and chip peripheral portion 30.

Instead, a plurality of p-type guard ring layers 41 are formed, as guard rings for maintaining high withstand voltage, between the chip peripheral portion 30 and active region 20 so as to surround the active region 20. The p-type guard ring layers 41 do not affect the operation of individual IGBT elements 100. Further, although other components are illustrated in FIG. 1, descriptions of those not directly related to the present invention will be omitted.

The semiconductor substrate 11 used in the above structure includes two layers: a p-type substrate 101 serving as a collector and a n layer 102 serving as a base. That is, the p-type substrate 101 and n layer 102 uniformly exist over the active region 20 and non-active region 40.

Meanwhile, the $p^+$ layer 103, $n^+$ layer 104, gate oxide film 105, and gate 106 illustrated in FIG. 4 are formed for each IGBT element. However, $p^+$ layers 103 and $n^+$ layers 104 of all IGBTs, each serving as an emitter, are connected by an emitter common electrode 21. Similarly, the gates 106 of all the IGBTs are connected by a gate electrode (not illustrated). Further, an insulating layer 22 obtained by integrating the insulating layers of FIG. 4 are formed over the entire surface. With the above configuration, in this IGBT 10, the IGBT elements 100 formed on the semiconductor substrate 11 are connected in parallel for operation.

In the IGBT 10, a defect layer 25 is formed in the n layer 102 in the active region 20 and formed in the p-type substrate 101 in the non-active region 40. That is, the defect layer 25 in the active region 20 is formed at a shallower position than the defect layer 25 in the non-active region 40 when viewed from the surface of the IGBT 10. The defect layer 25 is a layer in which many crystal damages which are introduced into the n layer 102 or p-type substrate 101 by implanting a light ion such as hydrogen ion (proton) or helium ion are introduced. The depth at which the defect layer 25 is formed is determined by the range of the implanted light ion. The defect layer 25 has a dimension extending in both the upper and lower directions of FIG. 1 with the depth (ion range) as the center according to the distribution of the implanted ion, and this dimension corresponds to the thickness of the defect layer 25. The depth position of the defect layer 25 and thickness thereof can appropriately be set depending on an ion implantation condition and, in particular, to make different the depth position of the defect layer 25 between the active region 20 and non-active region 40 is easily achieved by the following manufacturing method.

That is, unlike the structure disclosed in Patent Document 1, the position (depth position in FIG. 1) at which the defect layer 25 is formed is made different between the active region 20 and non-active region 40. The effect of above structure is as follows.

The lifetime of the holes is reduced in the defect layer 25 as described above, so that the amount of hole injection in the n layer 102 is affected by the existence of the defect layer 25. At this time, the effect of the defect layer 25 differs depending on the depth at which the defect layer 25 exists. For example, in the case where the defect layer 25 exists in the n layer 102, the holes injected from the interface (pn junction) between the p-type substrate 101 and n layer 102 are trapped by crystal defects in the defect layer 25. However, since the holes are injected by diffusion from the p-type substrate 101 into the n layer 102 (from the lower side to upper side in FIG. 1), the concentration of the holes is higher toward the pn junction. That is, the closer the defect layer 25 is to the pn junction, the larger the effect of reducing the hole injection amount becomes. Thus, in the case where the defect layer 25 is formed in the n layer 102, the closer the defect layer 25 is to the pn junction, the smaller the amount of hole injection becomes.

In the case where the defect layer 25 is formed in the p-type substrate 101, the number of holes to be injected in the defect layer 25 is small. Therefore, the defect layer 25 in the p-type substrate 101 also affects the amount of hole injection. For example, in the case where the defect layer 25 in the p-type substrate 101 exists at a portion away from the pn junction (that is, in the case where the defect layer 25 exists at the lower side in FIG. 1), the influence of the p-type layer having no crystal defect which is nearer to the pn junction than the defect layer 25 is to the pn junction becomes larger, so that the larger the distance between the defect layer 25 and pn junction, the larger the hole injection amount becomes. That is, although the mechanism is different from the case where the defect layer 25 exists in the n layer 102, the change in the hole injection amount in accordance with the distance between the defect layer 25 and pn junction occurs in the same manner in the case where the defect layer 25 exists in the p-type substrate 101.

Figure 2:
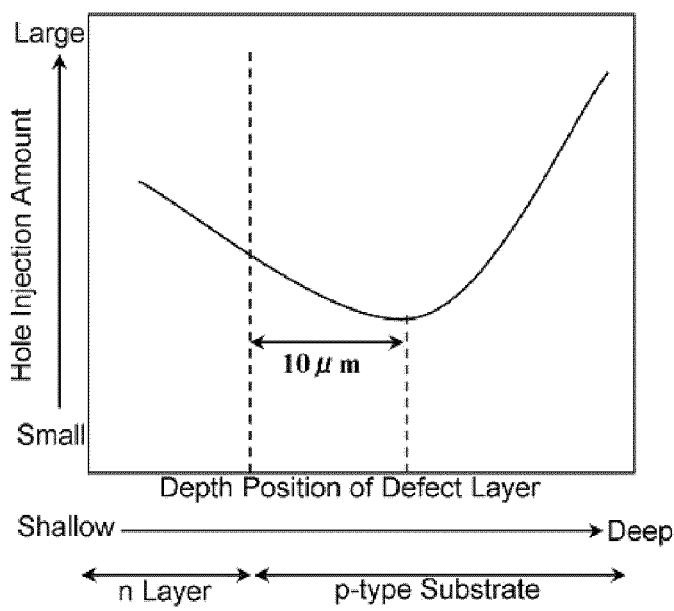
FIG. 2 is a view illustrating the relationship between the depth position of a defect layer formed in a semiconductor substrate and the hole injection amount.

Thus, in the case where the defect layer 25 exists near the pn junction, the hole injection amount becomes small, while in the case where the defect layer 25 exists away from the interface between the p-type substrate 101 and n layer 102 in the upper or lower direction of FIG. 1, the hole injection amount becomes large. Therefore, the relationship between the depth position of the defect layer 25 and the hole injection amount is conceptually as illustrated in FIG. 2. However, as described above, the mechanism in which the defect layer 25 exerts influence on the hole injection amount differs between the case where the defect layer 25 exists in the n layer 102 and where the defect layer 25 exists in the p-type substrate 101, so that characteristics of the relationship are not perfectly symmetric with respect to the pn junction. Accordingly, the depth at which the hole injection amount becomes minimum does not correspond to the pn-junction but is influenced by the device structure. It is found, experimentally, that what influences most significantly on the depth is the concentration of impurities in the p-type substrate 101, and there is a trend that the higher the concentration, the shallower the depth becomes. Specifically, experiments have revealed that when the concentration is $1\times10^{18}$ to $10^{19}$ cm$^{-3}$, the depth is set at a position about 10 μm shifted to the p-type substrate 101 side from the pn junction as illustrated in FIG. 2.

Thus, as illustrated in FIG. 1, in the case where the defect layer 25 is formed in the n layer 102 in the active region 20 and formed in the p-type substrate 101 in the non-active region 40, the influence of the defect layer 25 on the hole injection amount becomes larger in the non-active region 40. That is, although the p-type substrate 101 and n layer 102 are formed over the active region 20 and non-active region 40, the amount of the holes to be injected from the p-type substrate 101 to n layer 102 becomes smaller in the non-active region 40.

As described above, the holes to be injected not only contributes to a decrease in the on-resistance of the IGBT 10 but also contributes a decrease in the switching speed. At this time, the holes contributing to a decrease in the on-resistance, that is, the holes contributing to an increase in the operating current are mainly those injected in the location (active region 20) at which the IGBT element 100 is formed, and the contribution of the holes injected in the non-active region 40 to a decrease in the on-resistance is small. Meanwhile, when the holes injected in the non-active region 40 remain in OFF time, current flowing in the IGBT element 100 becomes hard to decay steeply. That is, the switching time becomes long. In other words, although the influence of the holes injected in the non-active region 40 on the on-resistance is small, the influence of the holes on the switching time is significant. Thus, when the hole injection amount in the non-active region 40 is reduced as compared to that in the active region 20, it is possible to increase the switching speed while keeping the on-resistance at a low level.

With the above configuration, in the IGBT 10, the hole injection amount in the non-active region 40 is reduced and, thereby the switching speed is increased. On the other hand, a reduction in the hole injection amount in the active region 20 is smaller in the active region 20 than that in the non-active region 40, with the result that an increase in the on-resistance is suppressed.

As a result, an IGBT having a good balance between high switching speed and low on-resistance can be obtained.

Although the defect layer 25 in the active region 20 is formed near the pn junction in the n layer 102, and that in the non-active region 40 is formed near the pn junction in the p-type substrate 101, the present invention is not limited to this. The same effect can be obtained as long as the hole injection amount in the position of the defect layer 25 in the non-active region 40 is smaller than that in the position of the defect layer 25 in the active region 20. For example, even in the case where the defect layer 25 is formed in the n layer 102 both in the active region 20 and non-active region 40 and where the defect layer 25 in the active region 20 is formed at a shallower position (upper side of FIG. 1) than the defect layer 25 in the non-active region 40, the same effect can be obtained. Further, even in the case where the defect layer 25 in the non-active region 40 is formed about 10 μm below the pn junction and the defect layer 25 in the active region 20 is formed at a shallower position than the defect layer 25 in the non-active region 40, the same effect can be obtained. Thus, in the case where the defect layer 25 in the non-active region 40 is formed within 10 μm from the pn junction in the depth direction and the defect layer 25 in the active region 20 is formed at a shallower position than the defect layer 25 in the non-active region 40, the same effect can be obtained.

Further, in the structure described above, by the reduction of the hole injection amount in the active region 20, parasitic transistor effect or latch-up phenomenon is suppressed. Therefore, it is possible to enhance the breakdown resistance of the IGBT.

Further, in the above example, an IGBT designed for non punch-through type, whose operation is determined by the hole injection amount from the p-type substrate 101 (emitter) side has been described. However, according to the principle described above, the configuration of the present embodiment can be effectively applied to an IGBT designed for punch-through operation whose operation is determined by the lifetime of the holes in the n layer 102 or an IGBT designed for light-punch-through operation. Further, the configuration of the present embodiment can be effectively applied also to a trench IGBT in which a trench structure is used to allow high integration of the MOS part.

Further, in the above example, the structure described above is formed on the p-type substrate. Alternatively, however, even in the case where an intrinsic substrate is used instead of the p-type substrate and the abovementioned structure is formed on a p layer formed by diffusing impurities on the intrinsic substrate, the same effect can be obtained. That is, any configuration of the semiconductor substrate may be adopted as long as the IGBT can perform the above operation modes.

Hereinafter, an example of a manufacturing method of the IGBT 10 will be described. The abovementioned structure can be easily formed by the following manufacturing method.

FIGS. 3(*a*) to 3(*b*) are process cross-sectional views schematically illustrating the manufacturing method. First, as illustrated in FIG. 3(*a*), a gate region, an emitter region, and the like in the IGBT are formed on the semiconductor substrate 11 (transistor formation step). This manufacturing process is the same as that disclosed in e.g., Patent Document 1. That is, the n layer 102 is formed by epitaxial growth on the silicon p-type substrate 101, whereby the semiconductor substrate 11 is obtained. Then, after formation of the gate oxide film 105, ion implantation of boron is selectively performed so as to form the p$^+$ layer 103 and, further, ion implantation of phosphorus, arsenic, and the like is performed in the same manner so as to form the n$^+$ layer 104. The gate 106 is formed by forming polysilicon on the gate oxide film 105 by a CVD (Chemical Vapor Deposition) method and by selectively etching the polysilicon.

Then, as illustrated in FIG. 3(*b*), a process (electrode formation step) of electrically connecting the IGBT elements 100 is performed. The insulating layer 22 is formed on the entire surface, contact holes are formed in the insulating layer 22 so as to secure electrical conduction with respect to each gate 106, each p$^+$ layer 103, and n$^+$ layer 104, and gate electrodes (not illustrated) and emitter common electrode 21 are formed through the contact holes. In forming these electrodes, a layer formed of a metal material is formed on the entire surface, and then lithography and etching (wet etching, dry etching) are performed to obtain the gate electrodes and emitter common electrode 21 having desired patterns. The processes up to here are the same as those in a known conventional manufacturing method.

The gate electrode may be formed only at the end of the active region 20 for connection of the gates 106. The emitter common electrode 21 is formed so as to cover most of the active region 20 as viewed from the above in FIG. 3(a) but not to cover the non-active region 40.

Figure 3A:
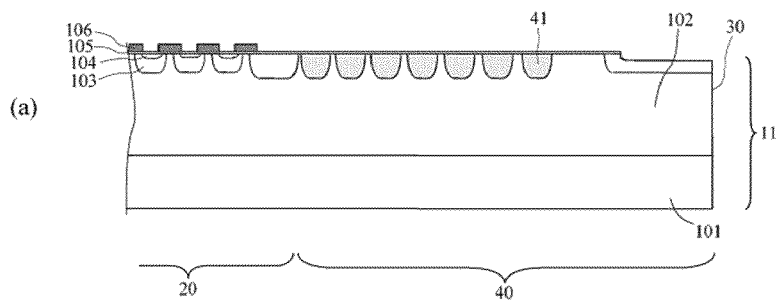
FIGS. 3 (a) to 3 (d) are process cross-sectional views schematically illustrating the manufacturing method.
Figure 3B:
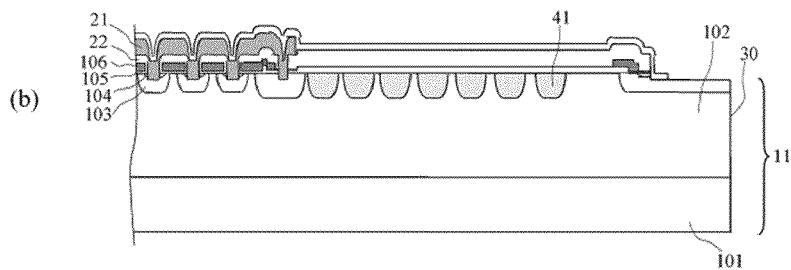
Figure 3C:
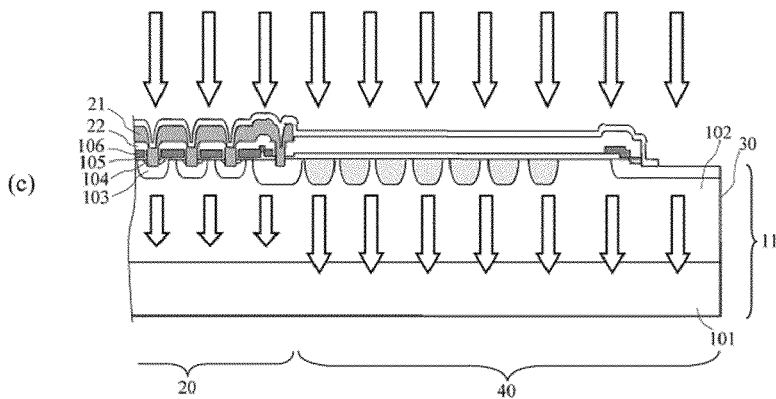

Then, as illustrated in FIG. 3(c), a light ion such as hydrogen ion or helium ion is implanted from the upper side (surface side) in FIG. 3(c) (ion implantation step). The ion implantation is performed uniformly over the entire surface. That is, the energy of the ion to be implanted is constant and the irradiation density is uniform.

This ion reaches the semiconductor substrate 11 (n layer 102). At this time, the ion reaches the n layer 102 after passing through a layer formed on the n layer 102. The layer formed on the n layer 102 includes the insulating layer 22, gate electrodes, emitter common electrode 21, and the like. The insulating layer 22 is formed of a material, such as $SiO_2$, having a comparatively low ion stopping power, so that the influence that the insulating layer 22 exerts on the ion is small. On the other hand, the emitter common electrode 21 is formed of a metal, so that it has a high ion stopping power. Further, as described above, the emitter common electrode 21 is formed over substantially the entire surface of the active region 20. The $p^+$ layer 103 and $n^+$ layer 104 each contain silicon as a main component as in the case of the n layer 102, so that the ion traveling toward the n layer 102 is not influenced by the presence/absence of the $p^+$ layer 103 or $n^+$ layer 104.

Thus, as illustrated in FIG. 3(c), the ion energy in the n layer 102 is attenuated by the existence of the emitter common electrode 21 and becomes effectively lower in the active region 20 than in the non-active region 40. The length of the arrow illustrated in FIG. 3(c) corresponds to the magnitude of the ion energy.

Figure 3D:
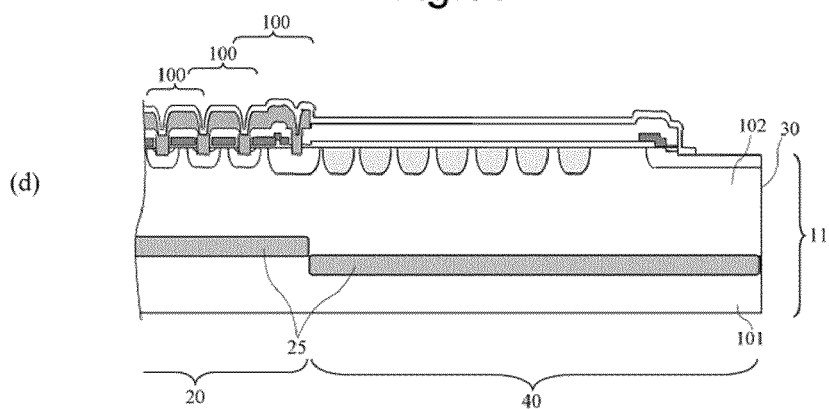

When the ion energy is high, the defect layer 25 is formed at a deeper position, while when the ion energy is low, the defect layer 25 is formed at a shallower position. Thus, as illustrated in FIG. 3(d), the defect layer 25 is formed at a shallower position in the active region 20 and at a deeper position in the non-active region 40. That is, the defect layer 25 having the configuration as illustrated in FIG. 1 is obtained.

In the manufacturing method, in order to perform ion implantation through the emitter common electrode 21, the material, thickness and ion energy of the emitter common electrode 21 are set such that the configuration of FIG. 3(d) is achieved. For example, when the emitter common electrode 21 is constituted by nickel (Ni) with the thickness of 0.5 μm, and ion implantation is conducted with the acceleration voltage of He ion being 20 keV, the defect layer 25 in the active region 20 is formed at a shallower position for about 4 μm than the defect layer 25 in the non-active region 40. Therefore, the above configuration can be achieved.

In the above manufacturing method, the ion implantation is conducted so as to form the defect layer 25. At this time, the depth positions of the defect layer 25 are made different in the active region 20 and non-active region 40 without conducting a new process step, e.g., lithography, to form a mask for the ion implantation. Thus, it is possible to manufacture the IGBT 10 having the structure illustrated in FIG. 1 by a simple procedure. Alternatively, it is possible to form the defect layer 25 in a self-alignment manner without conducting lithography, so that the defect layer 25 can be formed at a shallower position only in the active region 20 with high accuracy.

The ion species to be implanted is preferably a light ion such as hydrogen ion or helium ion, as in the case of Patent Document 1. If a heavy ion is implanted, in addition to the introduction of the crystal defects, various influences due to electrical effect that the implanted heavy ion itself has or due to implantation of constituent elements of the emitter common electrode 21, by knock on thereof, in the n layer 102 are generated.

The emitter common electrode 21 is formed of a material having a higher ion stopping power than that of the semiconductor substrate 11. Although the material and thickness of the emitter common electrode 21 are appropriately set as described above, the structure of the emitter common electrode 21 is not limited to a single layer structure but may be a multi-layered structure or a structure containing an alloy. For example, materials and structures, such as Al, Al/Cu, Al/Ti/Ni, Ti/Al or the like, may be used. However, Al is light and thus the ion deceleration effect is small, so that Ni or the like heavier than Al is preferably used. From this viewpoint, therefore, it is preferable that the emitter common electrode 21 contain Ni or Ni alloy and that a layered structure such as Al/Ni, Al/Ti/Ni/Au (Ag), or the like be used.

Actually, on the active region 20, in addition to the emitter common electrode 21, the gate electrode 106, insulating layer 22, and the like exist non-uniformly. However, when the emitter common electrode 21 is formed using the materials described above, influence that the constituent elements other than the emitter common electrode 21 exerts on the implanted ion can be comparatively reduced. Therefore, although strictly speaking, the depth position in the active region 20 at which the defect layer 25 is formed does not become uniform, no significant influence is exerted on acquisition of the abovementioned effects in the IGBT 10 by the constituent elements other than the emitter common electrode 21.

Further, although the emitter common electrode 21 is preferably formed so as to cover a wide range of the active region 20 in order to obtain the abovementioned effects, it need not cover the entire surface. For example, the emitter common electrode 21 may be formed only at locations at which the influence thereof on the operation of individual IGBT elements 100 is significant.

The IGBT (semiconductor device) having the above configuration can be manufactured by the manufacturing method described above. The manufacturing method of the present invention is not limited to this, but any other manufacturing method may be employed as long as the depth position of the defect layer 25 is made different between the active region 20 and non-active region 40. For example, although the manufacturing process becomes complicated, the IGBT having the same structure can be manufactured by forming a mask on the rear surface of the non-active region 40 in the semiconductor substrate 11 and implanting ion from the rear surface.

EXPLANATION OF REFERENCE SYMBOLS

10: IGBT (semiconductor device)
11: Semiconductor substrate
20: Active region
21: Emitter common electrode
22, 108: Insulating layer
25: Defect layer
30: Chip peripheral portion
40: Non-active region
41: p guard ring layer
100: IGBT element
101: p-type substrate
102: n layer
103: $p^+$ layer
104: $n^+$ layer
105: Gate oxide film
106: Gate
107: Emitter electrode

The invention claimed is:

1. A semiconductor device, comprising:
an insulated gate bipolar transistor element of the configuration where an emitter and a gate are formed on the front side thereof, using a p-type substrate as a collector and an n layer as a base, on a semiconductor substrate composed of the p-type substrate and the n layer formed on the p-type substrate, and in which a defect layer in which many crystal defects are introduced is formed in the semiconductor substrate, wherein
the defect layer in an active region where the insulated gate bipolar transistor element is formed on the semiconductor substrate, is a n-type defect layer formed in the n layer or a p-type defect layer formed in the p-type substrate,
the defect layer in a non-active region where the insulated gate bipolar transistor element is not formed on the semiconductor substrate, is a p-type defect layer formed in the p-type substrate,
and the defect layer in the active region is formed at a shallower position than the defect layer in the non-active region, when viewed from the surface.

2. The semiconductor device according to claim 1, wherein the defect layer is formed in the active region and the non-active region such that the hole injection amount in the non-active region is smaller than that in the active region.

3. The semiconductor device according to claim 1, wherein an emitter common electrode connected to the emitter of the insulated gate bipolar transistor element formed in the active region is formed of a material having higher ion stopping power than that of the semiconductor substrate.

4. The semiconductor device according to claim 3, wherein the emitter common electrode is formed of a material containing nickel or an alloy containing nickel.

5. The semiconductor device according to claim 1, wherein surface of the semiconductor substrate is flat on a boundary between the active region and the non-active region.

6. The semiconductor device according to claim 1, wherein the defect layer is formed by hydrogen or helium ion implantation.

7. A method of manufacturing a semiconductor device, which comprises an insulated gate bipolar transistor element of the configuration where an emitter and a gate are formed on the front side thereof, using a p-type substrate as a collector and an n layer as a base, on a semiconductor substrate composed of the p-type substrate and the n layer formed on the p-type substrate, and in which a defect layer in which many crystal defects are introduced is formed in the semiconductor substrate, the method comprising:
a transistor formation step of forming the insulated gate bipolar transistor element on the semiconductor substrate;
an electrode formation step of forming, on the insulated gate bipolar transistor element, an emitter common electrode connected to the emitter of the insulated gate bipolar transistor element; and
an ion implantation step of forming the defect layer in the semiconductor substrate by performing ion implantation from the front side, wherein
the defect layer in an active region where the insulated gate bipolar transistor element is formed on the semiconductor substrate, is a n-type defect layer formed in the n layer or a p-type defect layer formed in the p-type substrate,
the defect layer in a non-active region where the insulated gate bipolar transistor element is not formed on the semiconductor substrate, is a p-type defect layer formed in the p-type substrate,
and the defect layer in the active region is formed at a shallower position than the defect layer in the non-active region, when viewed from the surface.

* * * * *